US010529701B2

(12) United States Patent
Wu et al.

(10) Patent No.: US 10,529,701 B2
(45) Date of Patent: Jan. 7, 2020

(54) MICROLED DISPLAY PANEL

(71) Applicant: Prilit Optronics, Inc., Tainan (TW)

(72) Inventors: Biing-Seng Wu, Tainan (TW);
Fa-Ming Chen, Tainan (TW);
Shin-Hung Chen, Tainan (TW)

(73) Assignee: Prilit Optronics, Inc., Tainan (TW)

( * ) Notice: Subject to any disclaimer, the term of this patent is extended or adjusted under 35 U.S.C. 154(b) by 0 days.

(21) Appl. No.: 16/128,287

(22) Filed: Sep. 11, 2018

(65) Prior Publication Data

US 2019/0013307 A1   Jan. 10, 2019

Related U.S. Application Data

(63) Continuation-in-part of application No. 15/703,458, filed on Sep. 13, 2017, now Pat. No. 10,356,858.

(51) Int. Cl.
| | |
|---|---|
| *H05B 33/08* | (2006.01) |
| *H01L 25/16* | (2006.01) |
| *H01L 25/075* | (2006.01) |
| *H01L 23/538* | (2006.01) |
| *G09G 3/32* | (2016.01) |
| *H01L 33/58* | (2010.01) |

(52) U.S. Cl.
CPC .............. *H01L 25/167* (2013.01); *G09G 3/32* (2013.01); *H01L 23/5387* (2013.01); *H01L 25/0753* (2013.01); *G09G 2300/06* (2013.01); *G09G 2310/0267* (2013.01); *G09G 2310/0275* (2013.01); *G09G 2310/08* (2013.01); *H01L 33/58* (2013.01)

(58) Field of Classification Search
CPC ............. H05B 33/0815; H05B 33/0818; H05B 33/0884; H05B 33/0809
See application file for complete search history.

(56) References Cited

U.S. PATENT DOCUMENTS

| | | | |
|---|---|---|---|
| 2012/0092389 A1* | 4/2012 | Okuyama | G09F 9/33 345/690 |
| 2012/0320581 A1* | 12/2012 | Rogers | H01L 24/24 362/235 |
| 2015/0309312 A1* | 10/2015 | Alton | G02B 27/0172 345/592 |
| 2015/0331285 A1* | 11/2015 | Bibl | G02F 1/133603 362/84 |
| 2015/0355521 A1* | 12/2015 | Alton | G02F 1/167 250/214 AL |
| 2016/0231083 A1* | 8/2016 | Regan | F41G 1/38 |
| 2016/0240118 A1* | 8/2016 | Ray | G02B 27/225 |
| 2017/0061842 A1* | 3/2017 | Cok | G09G 3/2003 |
| 2017/0061867 A1* | 3/2017 | Cok | G09G 3/3208 |
| 2017/0187976 A1* | 6/2017 | Cok | H04N 5/376 |
| 2017/0294488 A1* | 10/2017 | Lin | H01L 27/3211 |
| 2017/0336831 A1* | 11/2017 | Zhang | G06F 3/0416 |

(Continued)

*Primary Examiner* — Douglas W Owens
*Assistant Examiner* — Syed M Kaiser
(74) *Attorney, Agent, or Firm* — Donald E. Stout; Stout, Uxa & Buyan, LLP

(57) ABSTRACT

A micro light-emitting diode (microLED) display panel includes microLEDs; a substrate for supporting the microLEDs, the substrate being divided into a plurality of sub-regions; and a plurality of chip-on-film (COF) packages mounted on surfaces of the sub-regions respectively, a plurality of drivers being disposed on the COF packages respectively.

11 Claims, 10 Drawing Sheets

(56) References Cited

U.S. PATENT DOCUMENTS

| | | | | |
|---|---|---|---|---|
| 2018/0025918 A1* | 1/2018 | Yamazaki | ......... | H01L 29/66969 |
| | | | | 438/270 |
| 2018/0040665 A1* | 2/2018 | Ohmae | ................... | H01L 29/41 |
| 2018/0061307 A1* | 3/2018 | Inoue | .................... | G09G 3/3275 |
| 2018/0067249 A1* | 3/2018 | Bang | .................... | G02B 6/0055 |
| 2018/0090058 A1* | 3/2018 | Chen | ......................... | G09G 3/32 |
| 2018/0092173 A1* | 3/2018 | Wu | ........................... | G09F 1/00 |
| 2018/0131886 A1* | 5/2018 | Cok | ....................... | H04N 5/376 |
| 2018/0306968 A1* | 10/2018 | Matsubara | ............ | G02B 6/0083 |
| 2018/0328581 A1* | 11/2018 | Komanduri | ......... | F21V 33/0052 |
| 2018/0348937 A1* | 12/2018 | Pak | ........................ | G06F 3/0412 |
| 2018/0358335 A1* | 12/2018 | Yoo | ..................... | H01L 21/6835 |

* cited by examiner

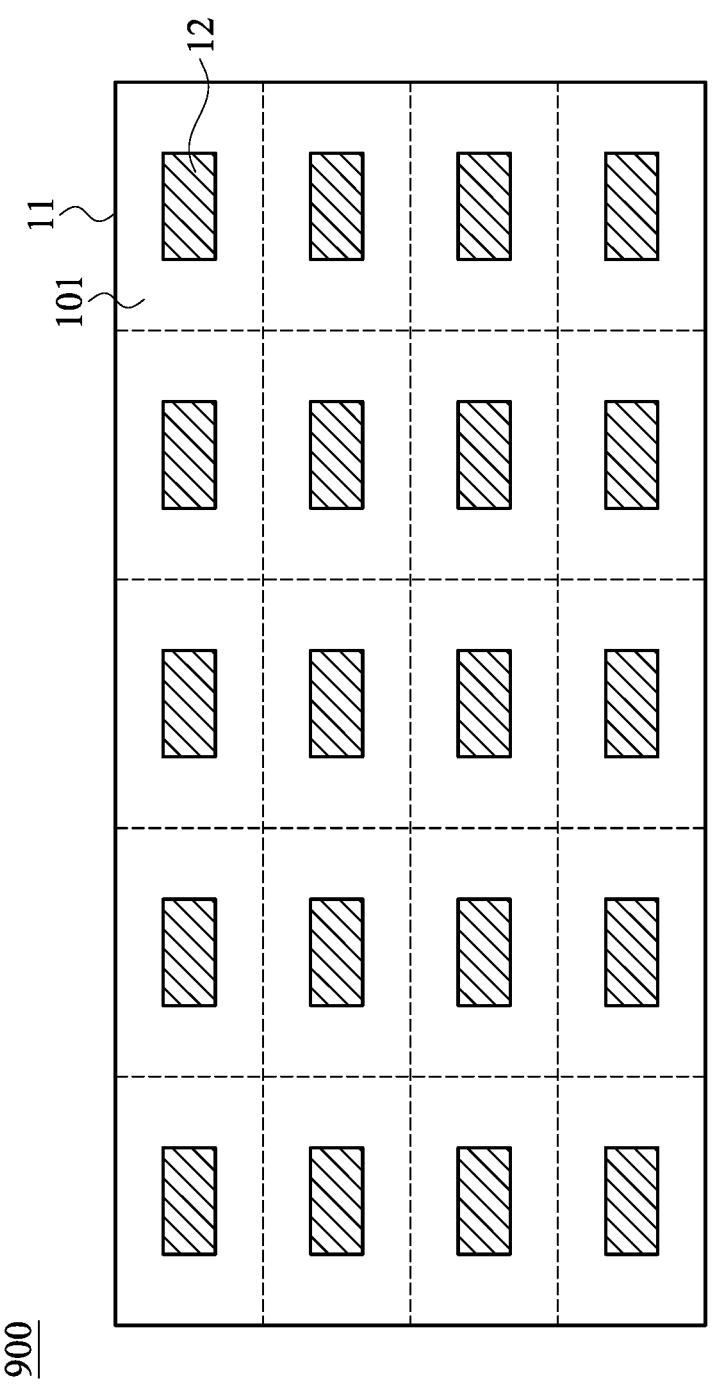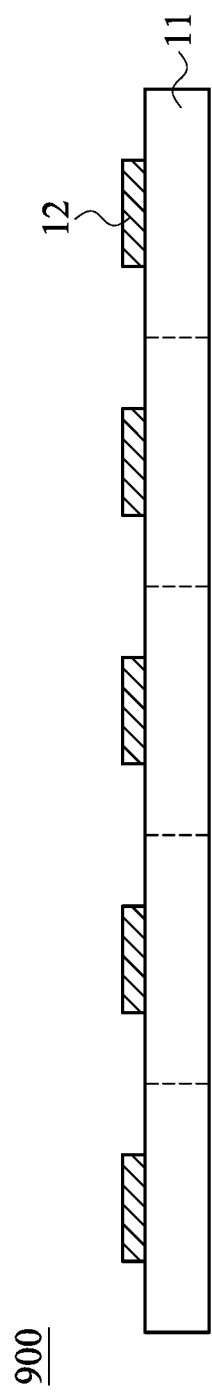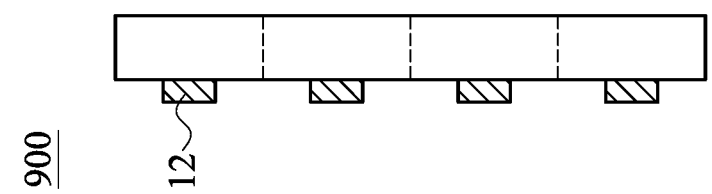

MICROLED DISPLAY PANEL

CROSS-REFERENCE TO RELATED APPLICATIONS

This application is a continuation-in-part application of U.S. application Ser. No. 15/703,458, filed on Sep. 13, 2017, which claims priority to Taiwan Application No. 105131054, filed on Sep. 26, 2016, and Taiwan Application No. 106118892, filed on Jun. 7, 2017. The entire contents of all of the foregoing applications are herein expressly incorporated by reference.

BACKGROUND OF THE INVENTION

1. Field of the Invention

The present invention generally relates to a display panel, and more particularly to a microLED display panel.

2. Description of Related Art

A micro light-emitting diode (microLED, mLED or μLED) display panel is one of flat display panels, which is composed of microscopic microLEDs each of a size of 1-10 micrometers. Compared to conventional liquid crystal display panels, the microLED display panels offer better contrast, response times and energy efficiency. Although both organic light-emitting diodes (OLEDs) and microLEDs possess good energy efficiency, the microLEDs, based on group III/V (e.g., GaN) LED technology, offer higher brightness, higher luminous efficacy and longer lifespan than the OLEDs.

Active matrix using thin-film transistors (TFT) may be used in companion with microLEDs to drive a display panel. However, microLED is made by flip chip technology, while TFT is made by complementary metal-oxide-semiconductor (CMOS) process which is more complex than flip chip technology. These two distinct technologies may cause thermal mismatch. A drive current of the microLED is small in gray display, which may be significantly affected by leakage current.

Passive matrix is another driving method performed by a row drive circuit and a column drive circuit, which are disposed on the periphery of a display panel. When the size or the resolution of the display panel increases, output loading and delay of the drive circuits increase accordingly, causing the display panel to malfunction. Therefore, passive matrix is not suitable for large-size microLED display panels.

A need has thus arisen to propose a novel microLED display panel, particularly a large-size or high-resolution display panel, which is capable of maintaining advantages of microLEDs and overcoming disadvantages of driving schemes.

SUMMARY OF THE INVENTION

In view of the foregoing, it is an object of the embodiment of the present invention to provide a microLED display panel capable of effectively reducing loading of drivers, thereby making whole large-size high-resolution microLED display panel feasible.

According to one embodiment, a micro light-emitting diode (microLED) display panel includes microLEDs, a substrate and chip-on-film (COF) packages. The substrate supports the microLEDs and is divided into a plurality of sub-regions. The COF packages are mounted on surfaces of the sub-regions respectively, and a plurality of drivers are disposed on the COF packages respectively.

BRIEF DESCRIPTION OF THE DRAWINGS

FIG. 9A to FIG. 9C schematically show a top view, a front side view and a right-hand side view, respectively, illustrating a microLED display panel with drivers mounted thereon by COG technique;

DETAILED DESCRIPTION OF THE INVENTION

Figure 1A:
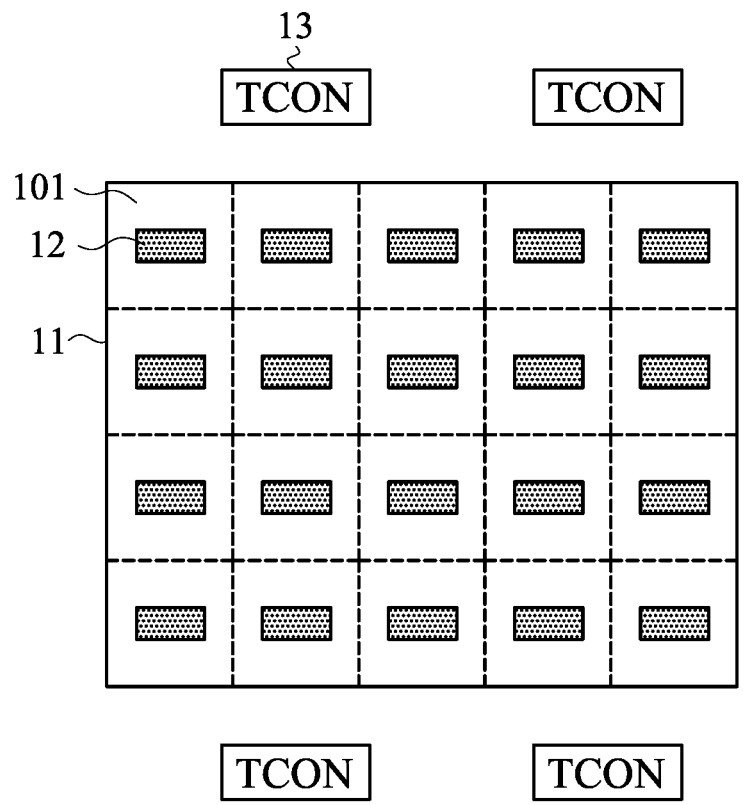
FIG. 1A shows a top view illustrated of a microLED display panel according to one embodiment of the present invention.
Figure 1B:
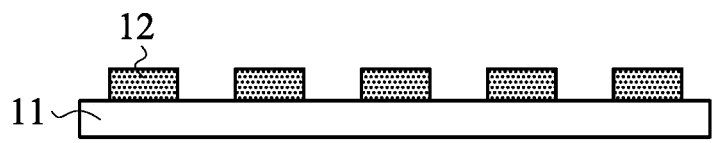
FIG. 1B shows a side view illustrated of the microLED display panel of FIG. 1A.

FIG. 1A shows a top view illustrated of a micro light-emitting diode (microLED) display panel 100 according to one embodiment of the present invention, and FIG. 1B shows a side view illustrated of the microLED display panel 100 of FIG. 1A. The microLED display panel of the embodiment is preferably adaptable to a large-size and high-resolution (e.g., 3840RGB×2160) display panel. In the specification, the size range of the microLED is between 1 and 10 micrometers. However, the size of the microLED may be even smaller due to specific applications or technological advance. In the specification, "large-size" display panel is currently and commonly referred to 10 inches or above display panel. However, "large-size" display panel may be referred to other display size due to specific applications or technological advance. In the specification, "high-resolution" display panel is currently and commonly referred to a display panel with 1080 or above scan lines.

However, "high-resolution" display panel may be referred to other amount of scan lines due to specific applications or technological advance.

In the embodiment, the microLED display panel 100 may include a substrate 11 for supporting a plurality of microLEDs (not shown). The substrate 11 may be preferably made of an insulating material (e.g., glass or Acrylic) or other materials suitable for supporting the microLEDs.

According to one aspect of the embodiment, a surface of the substrate 11 is divided into a plurality of sub-regions 101. It is noted that the divided sub-regions 101 are not physically cut through, and the substrate 11 is not made by integrating the sub-regions 101. In other words, the substrate 11 or the microLED display panel 100 is a single or whole entity, or an uncut entity. FIG. 1A shows a simplified example of how the substrate 11 is divided into sub-regions 101. Take a microLED display panel 100 with resolution 3840RGB×2160 as an example, the substrate 11 may be divided into 80×54 sub-regions 101, each having resolution 48RGB×40. Nevertheless, this microLED display panel 100 may be divided into more or less sub-regions 101.

According to another aspect of the embodiment, the microLED display panel 100 may include a plurality of drivers 12, which are correspondingly disposed on (e.g., top) surfaces of the sub-regions 101 respectively. The driver 12 as exemplified in FIG. 1A may, but not necessarily, be disposed in the center of the surface of corresponding sub-region 101. Each sub-region 101 as exemplified in FIG. 1A has one corresponding driver 12. However, in other embodiments, each sub-region 101 may have plural corresponding drivers 12. The driver 12 of the embodiment may be manufactured as an integrated circuit or chip, which is then bonded on the surface of the sub-region 101, for example, by surface-mount technology (SMT) such as chip-on-glass (COG) or flip chip. In one example, the drivers 12 and the microLEDs are disposed on the same surface of the substrate 11.

The microLED display panel 100 of the embodiment may further include a plurality of timing controllers (TCON) 13, which are electrically connected with the substrate 11, for example, via a flexible printed circuit board (FPCB), and are further electrically connected with corresponding drivers 12, for example, via signal traces (not shown) disposed on the substrate 11. In the embodiment, one timing controller 13 may be electrically connected with at least two drivers 12. In other words, the amount of the timing controllers 13 may be less than the amount of the drivers 12. The timing controller 13 may be electrically connected directly with corresponding drivers 12 via signal traces. Alternatively, the timing controller 13 may be electrically connected to one driver 12 via signal traces, and, after signal buffering, then be electrically connected to another driver 12 via signal traces.

Figure 2:
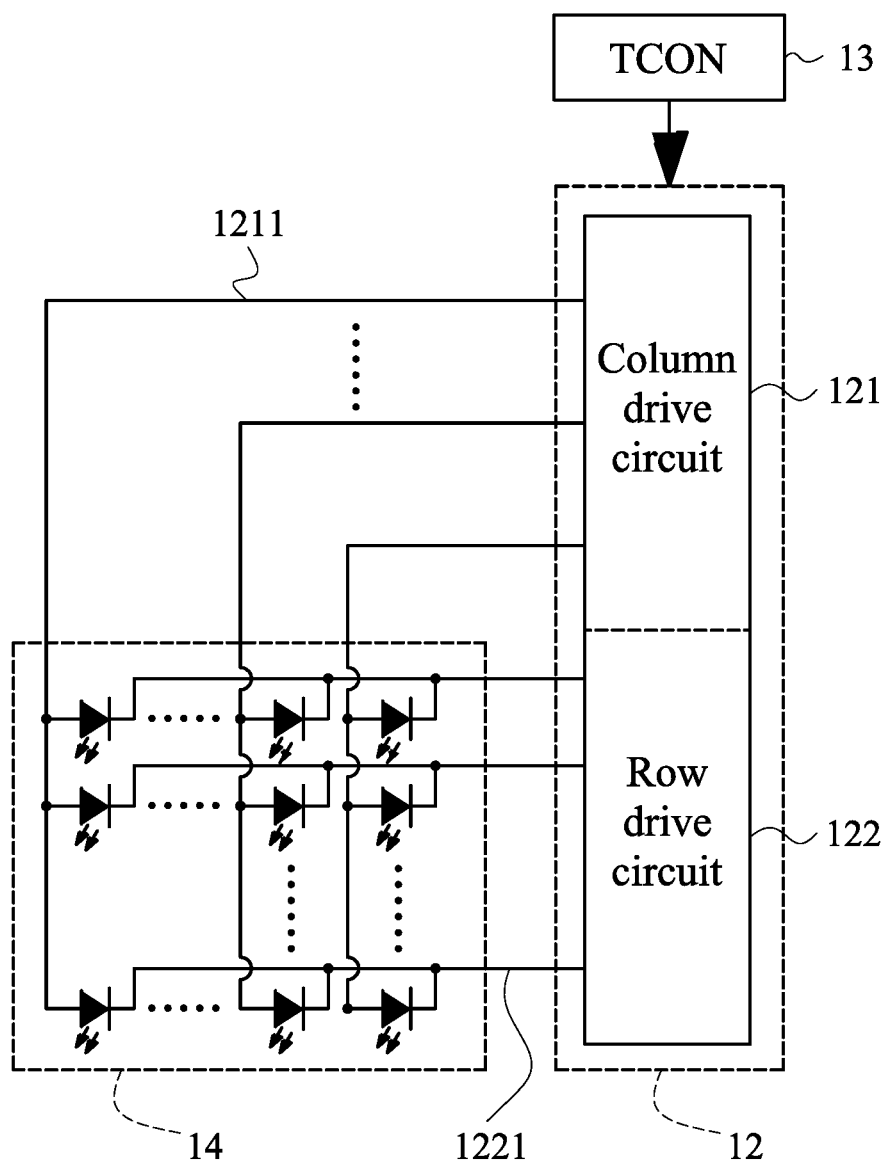
FIG. 2 shows a schematic diagram illustrated of passive driving the microLED display panel.

According to a further aspect of the embodiment, the microLED display panel 100 may adopt passive driving method for driving the microLEDs. FIG. 2 shows a schematic diagram illustrated of passive driving the microLED display panel 100. The timing controller 13 transmits timing control signals and data signals to the driver 12. The driver 12 may include a column drive circuit 121 and a row (or scan) drive circuit 122. The column drive circuit 121 transmits column drive signals to first electrodes (e.g., anodes) of the microLEDs 14 on the same columns via column conductive wires 1211, and the row drive circuit 122 transmits row drive signals to second electrodes (e.g., cathodes) of the microLEDs 14 on the same rows via row conductive wires 1221. In the embodiment, the column drive circuit 121 and the row drive circuit 122 are made in a single integrated circuit.

According to the embodiment discussed above, the substrate 11 of the microLED display panel 100 is divided into sub-regions 101, each of which has a corresponding driver 12. Therefore, loading of the column drive circuit 121 and the row drive circuit 122 may be effectively reduced, thereby making whole large-size high-resolution microLED display panel feasible. Moreover, the microLED display panel 100 of the embodiment adopts a passive driving method (instead of active driving method using thin-film transistors) for driving the microLEDs 14, thereby simplifying the process of making display panels, reducing turn-on time of the microLEDs 14, increasing drive current, and effectively minimizing effect on gray display due to leakage current.

Figure 3:
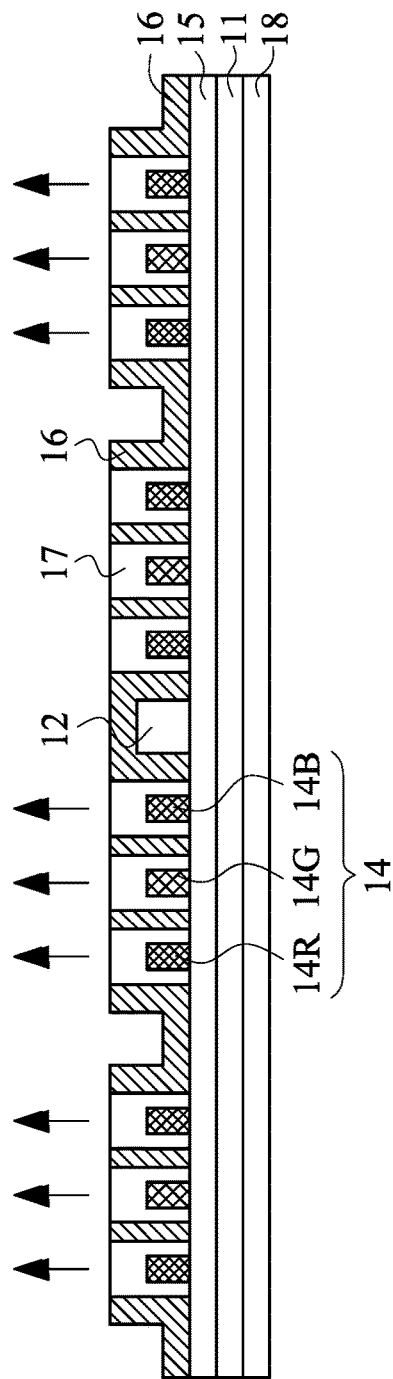
FIG. 3 shows a cross-sectional view illustrated of a frontside illuminating microLED display panel according to a first specific embodiment of the present invention.

FIG. 3 shows a cross-sectional view illustrated of a frontside illuminating microLED display panel 300 according to a first specific embodiment of the present invention. In the embodiment, the microLEDs 14 and the driver 12 are disposed above a top surface of the substrate 11. Light generated by the microLEDs 14 primarily emits upward (i.e., frontside illuminating) from the top surface of the substrate 11 as indicated by arrows.

As exemplified in FIG. 3, each pixel may include a red microLED 14R, a green microLED 14G and a blue microLED 14B. A trace layer 15 is disposed between a (e.g., top) surface of the substrate 11 and the microLEDs 14 and the driver 12. The trace layer 15 is configured to electrically connect the driver 12, the microLEDs 14 and the timing controller 13. A light blocking layer 16 is disposed between adjacent pixels and above the trace layer 15. The light blocking layer 16 of the embodiment may be made of black matrix (BM) or other materials suitable for blocking light. In one embodiment, the light blocking layer 16 may be optionally disposed among the red microLED 14R, the green microLED 14G and the blue microLED 14B of the same pixel.

A light guide layer 17 may be disposed above the red microLED 14R, the green microLED 14G and the blue microLED 14B. The frontside illuminating microLED display panel 300 of the embodiment may further include a cover plate 18 disposed on a bottom surface of the substrate 11. The cover plate 18 of the embodiment may be made of an opaque material.

Figure 4:
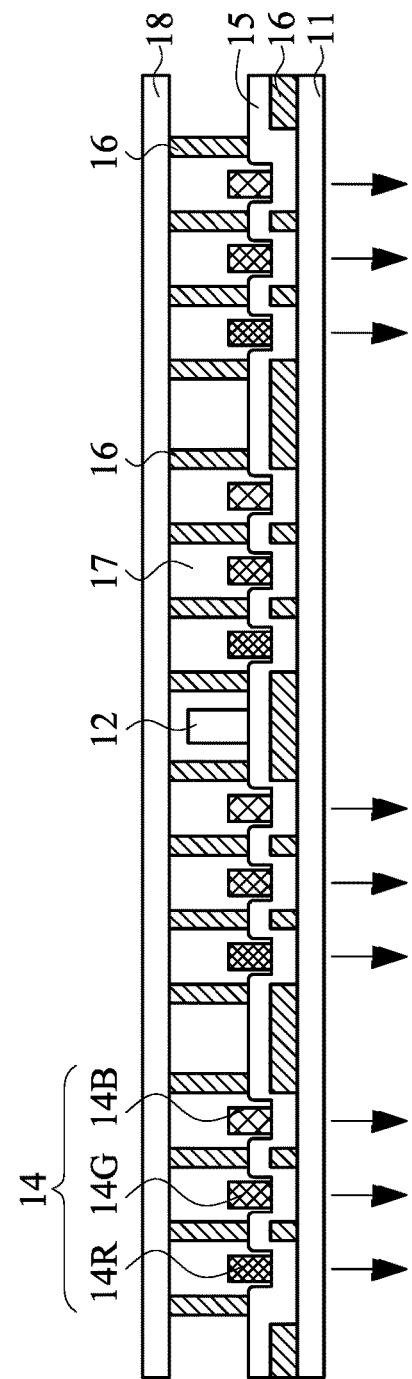
FIG. 4 shows a cross-sectional view illustrated of a backside illuminating microLED display panel according to a second specific embodiment of the present invention.

FIG. 4 shows a cross-sectional view illustrated of a backside illuminating microLED display panel 400 according to a second specific embodiment of the present invention. In the embodiment, the microLEDs 14 and the driver 12 are disposed above a top surface of the substrate 11. Light generated by the microLEDs 14 primarily emits downward (i.e., backside illuminating) from the bottom surface of the substrate 11 as indicated by arrows.

As exemplified in FIG. 4, each pixel may include a red microLED 14R, a green microLED 14G and a blue microLED 14B. A light blocking layer 16 is disposed between adjacent pixels and above a (e.g., top) surface of the substrate 11. The light blocking layer 16 of the embodiment may be made of black matrix (BM) or other materials suitable for blocking light. A trace layer 15 is disposed above the light blocking layer 16 for electrically connecting the driver 12, the microLEDs 14 and the timing controller 13. In one embodiment, the light blocking layer 16 may be optionally disposed among the red microLED 14R, the green microLED 14G and the blue microLED 14B of the same pixel.

A light guide layer 17 may be disposed above the red microLED 14R, the green microLED 14G and the blue microLED 14B. The backside illuminating microLED display panel 400 of the embodiment may further include a cover plate 18 disposed above the driver 12, the trace layer 15, the light blocking layer 16 and the light guide layer 17. The cover plate 18 of the embodiment may be made of an opaque material.

Figure 5:
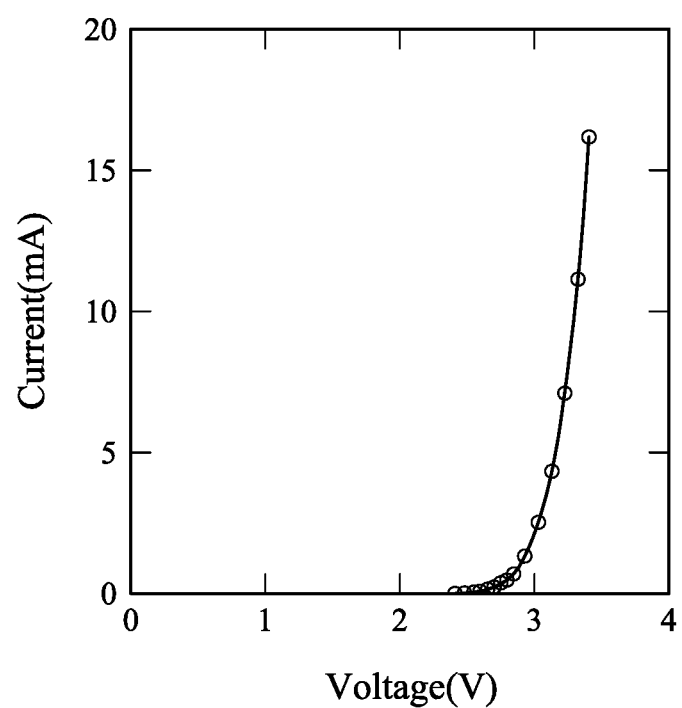
FIG. 5 shows an exemplary current-voltage curve of a microLED.

FIG. 5 shows an exemplary current-voltage curve of a microLED 14. When an operating voltage is greater than a turn-on voltage Vf (e.g., 3 volts), a current greater than a predetermined value may be obtained to normally operate and turn on the micro-LED 14. For the microLED display panel 100 shown in FIG. 1A, a system power for the drivers 12 is VDDA. However, a voltage drop ΔV exists in the center of the microLED display panel 100 due to impedance in the conductive wire for transferring the power. Accordingly, the drivers 12 disposed in the center of the microLED display panel 100 in fact receive power of VDDA−ΔV, although the drivers 12 disposed on the periphery of the microLED display panel 100 receive power of VDDA. For example, assume the voltage drop ΔV is 1 volt and the turn-on voltage Vf is 3 volts. The condition under which the drivers 12 may be normally operated is VDDA−1>3, that is, VDDA>4 (e.g., VDDA of 5 volts is required). In this situation, the drivers 12 may be made by low-voltage metal-oxide-semiconductor (MOS) process.

Nevertheless, as the amount of microLEDs 14 increases, consumed current then increases and a voltage drop ΔV significantly increases accordingly (e.g., increases to 4 volts). The condition under which the drivers 12 may be normally operated is VDDA−4>3, that is, VDDA>7 (e.g., VDDA of 8 volts is required). In this situation, the drivers 12 should be made by high-voltage metal-oxide-semiconductor (MOS) process, which results in larger circuit area that is unfavorable for making large-size high-resolution (e.g., 3840RGB×2160) display panel. For overcoming the problems, an architecture of a novel driver 12 is proposed.

Figure 6:
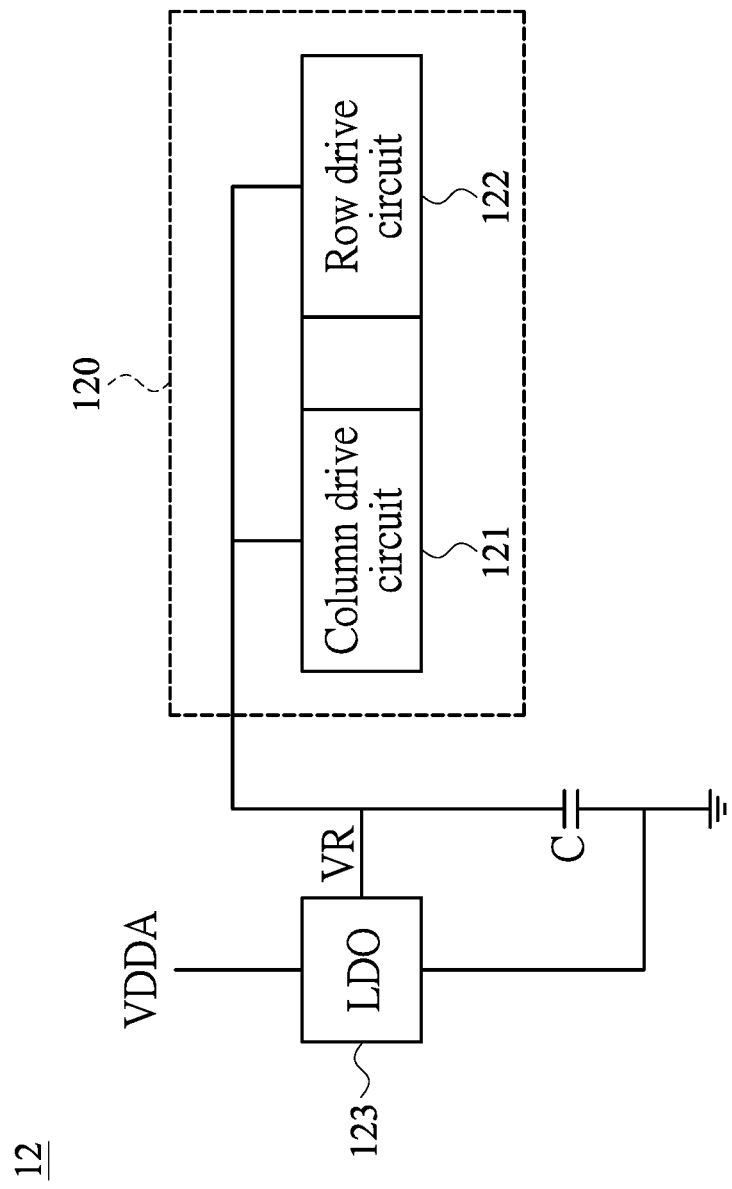
FIG. 6 shows a system block diagram illustrated of a driver according to one embodiment of the present invention.

FIG. 6 shows a system block diagram illustrated of a driver 12 according to one embodiment of the present invention. In the embodiment, the driver 12 may include a low-dropout (LDO) regulator 123 and a drive circuit 120. The LDO regulator 123 receives a system power VDDA, according to which a regulated power VR (e.g., 5 volts) is generated and provided as a power for the drive circuit 120. The LDO regulator 123 of the embodiment may be implemented according to circuit design of conventional LDO regulators, and details of which are thus omitted for brevity. The drive circuit 120 of the embodiment may include a column drive circuit 121 and a row drive circuit 122. The LDO regulator 123 is one of direct-current (DC) linear regulators, which are configured to generate a regulated power VR substantially equal to the system power VDDA. Compared to a switching regulator, the LDO regulator 123 occupies less circuit area with simpler circuit design and without switching noise. In the embodiment, a smoothing capacitor C may be interposed between the regulated power VR and earth, thereby filtering out high-frequency noise. The smoothing capacitor C may be formed with a metal layer process (instead of extra process) commonly used in display panel manufacturing.

According to the driver 12 of the embodiment as discussed above, only the LDO regulator 123 should be made by high-voltage (e.g., greater than 8 volts) MOS process, while the drive circuit 120 may be made by low-voltage (e.g., less than 8 volts) MOS process. On the contrary, for a driver without LOD regulator 123, entire driver 12 should be made by high-voltage MOS process. As a result, the driver 12 of the embodiment may significant reduce circuit area and facilitate making large-size or high-resolution display panels.

Figure 7A:
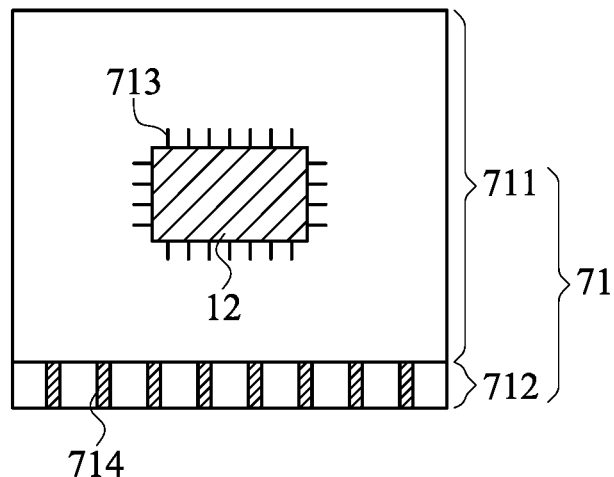
FIG. 7A shows a schematic diagram illustrating a chip-on-film (COF) package for a driver according to one embodiment of the present invention.

FIG. 7A shows a schematic diagram illustrating a chip-on-film (or chip-on-flex) (COF) package 700 for a driver 12 (a display driver integrated circuit (DDIC) in this case) according to one embodiment of the present invention. The COF package 700 may include a flexible printed circuit board (FPCB) 71, which may include at least a main region 711 and a bonding region 712. The bonding region 712 is substantially smaller in size than the main region 711, and the bonding region 712 is adjacent to one edge of the main region 711.

The COF package 700 of the embodiment may include a driver 12 mounted on the main region 711. Specifically, a chip, such as the driver 12 in this case, has connection pins 713 disposed on four edges of the chip. The connection pins 713 of the chip are then electrically routed to finger connectors 714 of the bonding region 712 via traces (not shown) on the main region 711. Accordingly, connection pins 713 on four edges of the chip are thus transformed to the finger connectors 714 disposed on only one edge of the FPCB 71, that is, on the bonding region 712.

Figure 7B:
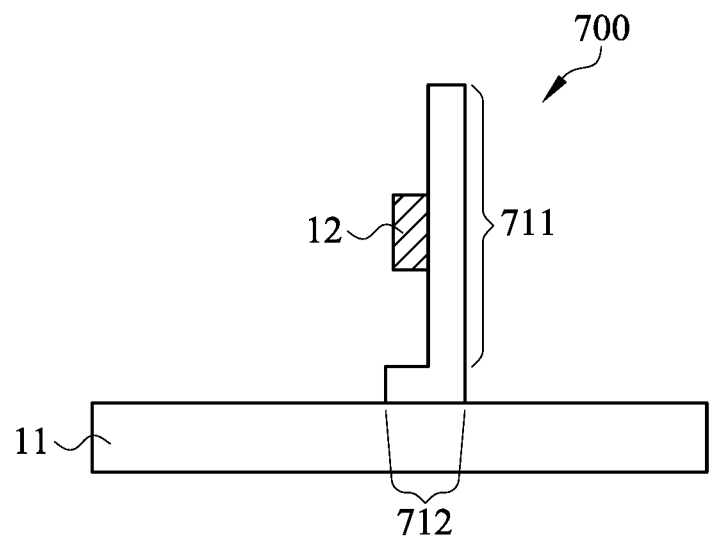
FIG. 7B shows a side view illustrating the COF package of FIG. 7A mounted on a substrate of a microLED display panel according to one embodiment of the present invention.

FIG. 7B shows a side view illustrating the COF package 700 of FIG. 7A mounted on a substrate 11 of a microLED display panel according to one embodiment of the present invention. Specifically, in the embodiment, the bonding region 712 is bent along a boundary between the bonding region 712 and the main region 711, and the bonding region 712 is then mounted on the substrate 11. Accordingly, the driver 12 is hanging in the air above the substrate 11. Although the main region 711 of the FPCB 71 stands at a 90 degree angle as exemplified in FIG. 7B, it is appreciated that, generally speaking, the FPCB 71 may stand on the substrate 11 at an angle between 0 and 180 degrees.

Figure 8C:
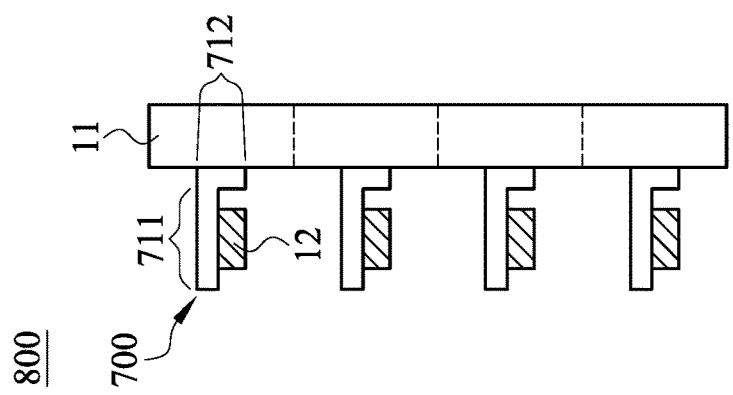
FIG. 8A to FIG. 8C schematically show a top view, a front side view and a right-hand side view, respectively, illustrating a microLED display panel with COF packages mounted thereon.
Figure 8A:
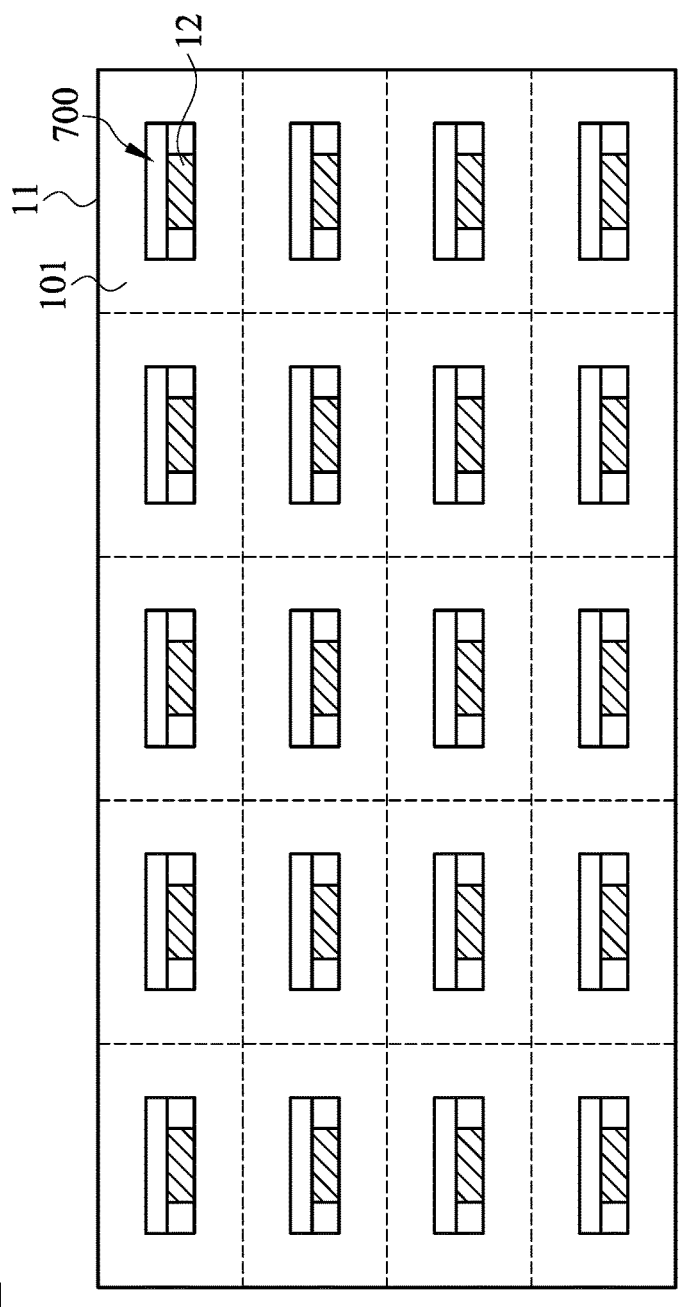
Figure 8B:
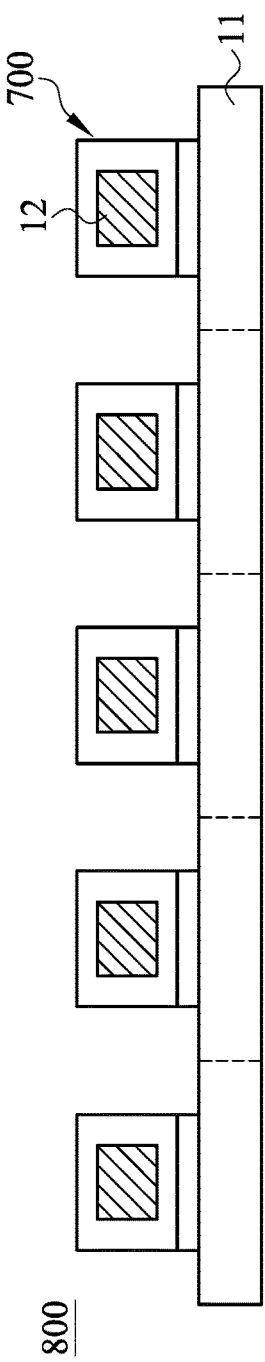

FIG. 8A to FIG. 8C schematically show a top view, a front side view and a right-hand side view, respectively, illustrating a microLED display panel 800 with COF packages 700 mounted thereon. In the embodiment, the microLED display panel 800 may preferably be a backside illuminating microLED display panel, as exemplified in FIG. 4, that generates light emitting downward from the bottom surface of the substrate 11.

In the embodiment, the microLED display panel 800 may include a substrate 11 for supporting a plurality of microLEDs (not shown). The substrate 11 may be preferably made of an insulating material (e.g., glass or Acrylic) or other materials suitable for supporting the microLEDs. The surface of the substrate 11 is divided into a plurality of sub-regions 101. According to one aspect of the embodiment, the microLED display panel 800 may include a plurality of COF packages 700 respectively mounted on a top surface of the sub-regions 101 the substrate 11. The microLED display panel 800 of the embodiment may include a plurality of drivers 12 mounted on the main regions 711 of the COF packages 700, respectively. As described above in connection with FIG. 7B, the COF package 700 is mounted on (or bounded with) the substrate 11 via the bonding region 712 such that the driver 12 is hanging above the substrate 11. As the bonding region 712 requires substantially less area compared to the main region 711 or the driver 12, the COF package 700 occupies only a substantially small area of the substrate 11, and majority of the precious area of the substrate 11 may thus be provided for placing, among others, microLEDs.

Compared with chip-on-glass (COG) technique adopted in other embodiments, in which (connection pins of) the chips (i.e., the drivers 12) are directly mounted on the surface of the substrate 11, the COF packages 700 of the present embodiment occupy substantially less area than the COG embodiments. FIG. 9A to FIG. 9C schematically show a top view, a front side view and a right-hand side view, respectively, illustrating a microLED display panel 900 with drivers 12 mounted thereon by COG technique. As the drivers 12 are directly mounted on the substrate 11, the drivers 12 occupy substantive area of the precious area of the substrate 11 with less area left for placing the microLEDs. In this concern, the drivers 12 need be fabricated smaller but with more technical difficulties and higher cost. Moreover, the COF package 700 can substantially overcome voltage-drop effect caused by long trace in large-size microLED display panels. Further, trace width may be shrank, thus effectively increasing resolution of the microLED display panels.

Figure 10A:
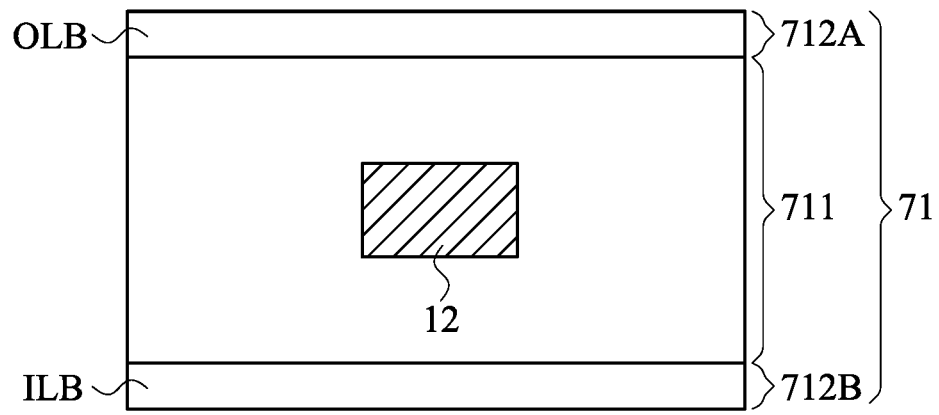
FIG. 10A shows a schematic diagram illustrating a chip-on-film (COF) package for a driver according to another embodiment of the present invention.

FIG. 10A shows a schematic diagram illustrating a chip-on-film (COF) package 700B for a driver 12 according to another embodiment of the present invention. The COF package 700B is similar to the COF package 700 of FIG. 7A, with the exception that, in the COF package 700B, the flexible printed circuit board (FPCB) 71 may include a main region 711, a first bonding region 712A and a second bonding region 712B. The first bonding region 712A and the second bonding region 712B are adjacent to opposite edges of the main region 711, respectively. In the embodiment, the first bonding region 712A adopts outer lead bonding (OLB) technique for bonding with a glass, and the second bonding region 712B adopts inner lead bonding (ILB) technique for bonding with a printed circuit board.

Figure 10B:
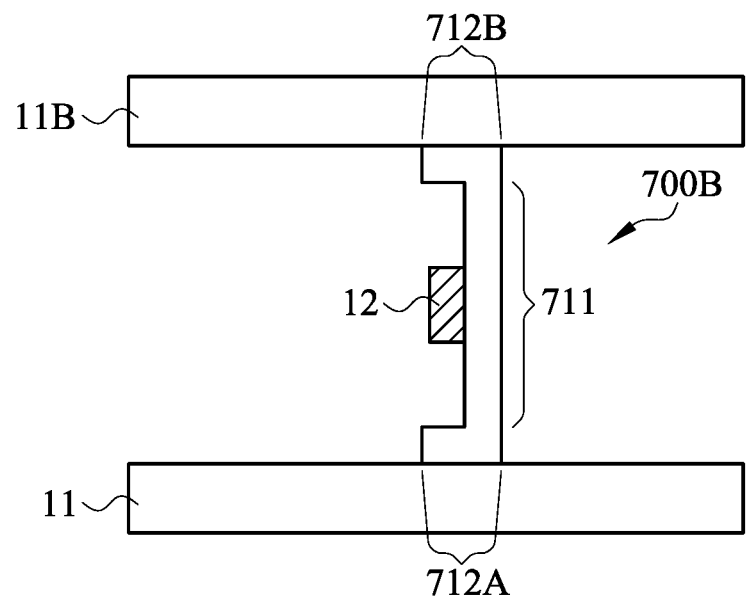
FIG. 10B shows a side view illustrating the COF package of FIG. 10A mounted on a substrate and a printed circuit board of a microLED display panel according to one embodiment of the present invention.

FIG. 10B shows a side view illustrating the COF package 700B of FIG. 10A mounted on a substrate 11 (e.g., glass) of a microLED display panel via the first bonding region 712A and mounted on a printed circuit board 11B (e.g., FPCB) via the second bonding region 712B according to one embodiment of the present invention. In one example, the printed circuit board 11B is electrically connected to a control system such as timing controllers (TCON).

Figure 11:
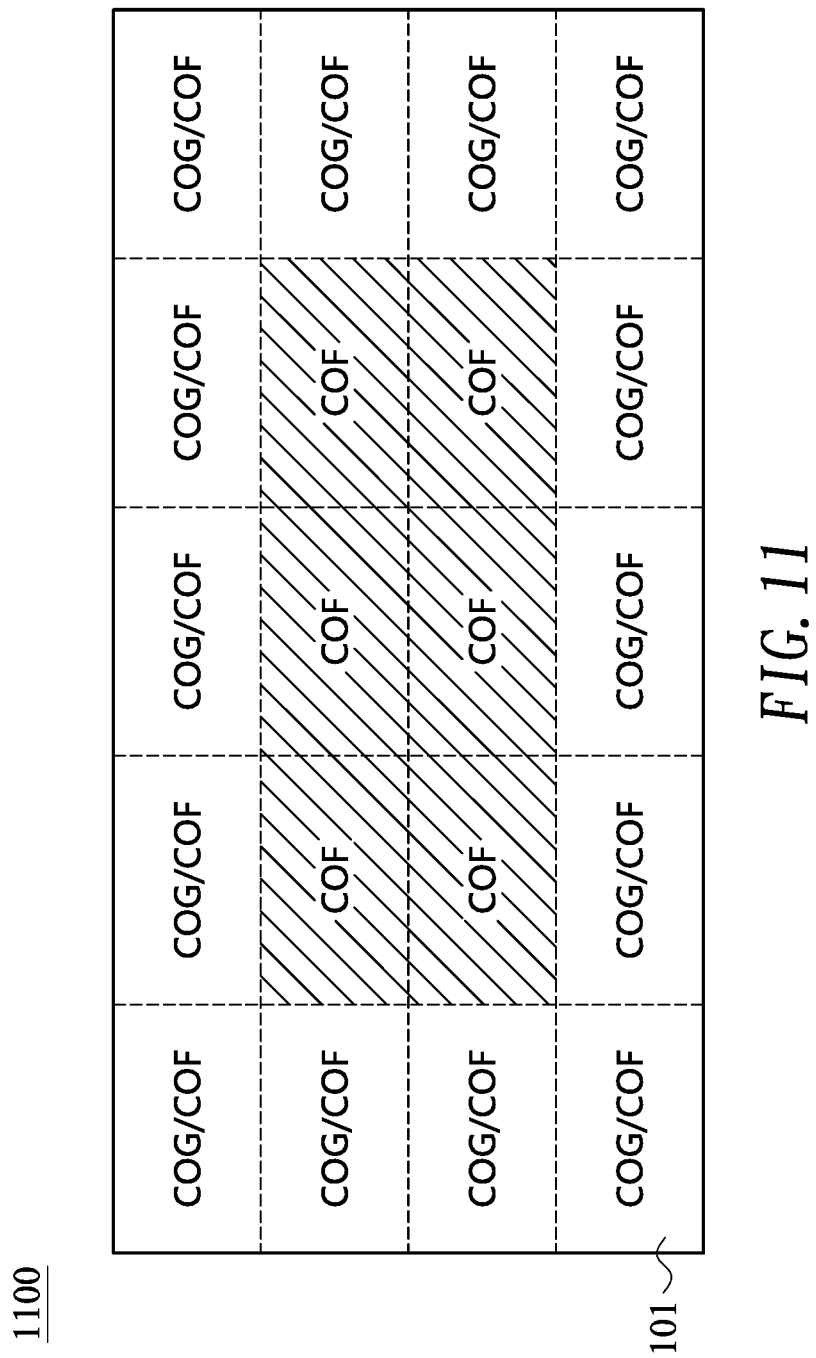
FIG. 11 schematically shows a top view illustrating a microLED display panel.

FIG. 11 schematically shows a top view illustrating a microLED display panel 1100. In the embodiment, drivers (not shown) may be mounted on (non-shaded) boundary sub-regions 101 by using either COG or COF technique, while other drivers may be mounted on (shaded) center sub-regions 101 by using COF technique, thereby facilitating connecting the drivers mounted on the center sub-regions 101 to the timing controllers.

Although specific embodiments have been illustrated and described, it will be appreciated by those skilled in the art that various modifications may be made without departing from the scope of the present invention, which is intended to be limited solely by the appended claims.

What is claimed is:

1. A micro light-emitting diode (microLED) display panel, comprising:
   a plurality of microLEDs;
   a substrate for supporting the microLEDs, the substrate being divided into a plurality of sub-regions; and
   a plurality of chip-on-film (COF) packages mounted on surfaces of the sub-regions respectively, a plurality of drivers being disposed on the COF packages respectively;
   wherein the COF package comprises a main region, a first bonding region and a second bonding region, the first bonding region and the second bonding region being adjacent to opposite edges of the main region, respectively.

2. The microLED display panel of claim 1, wherein the COF package comprises a flexible printed circuit board (FPCB), the driver being disposed on the main region.

3. The microLED display panel of claim 2, wherein the first bonding region is substantially smaller in size than the main region, and the first bonding region is adjacent to one edge of the main region.

4. The microLED display panel of claim 2, wherein the driver has connection pins disposed on four edges of the driver, and the connection pins are then electrically routed to finger connectors disposed on the first bonding region.

5. The microLED display panel of claim 2, wherein the first bonding region is bent along a boundary between the first bonding region and the main region, and the first bonding region is then mounted on the substrate.

6. The microLED display panel of claim 2, wherein the FPCB stands on the substrate at an angle between 0 and 180 degrees.

7. The microLED display panel of claim 1, wherein the microLED display panel is a backside illuminating microLED display panel that generates light emitting downward from a bottom surface of the substrate.

8. The microLED display panel of claim 1, wherein the substrate comprises an insulating material.

9. The microLED display panel of claim 8, wherein the substrate comprises glass or Acrylic.

10. The microLED display panel of claim 1, wherein the first bonding region adopts outer lead bonding (OLB) technique, and the second bonding region adopts inner lead bonding (ILB) technique.

11. The microLED display panel of claim 1, wherein some of the drivers are mounted on boundary sub-regions of the substrate by using either chip-on-glass (COG) or COF technique, while others of the drivers are mounted on center sub-regions of the substrate by using COF technique.

* * * * *